(12) United States Patent
Li

(10) Patent No.: US 11,553,591 B2
(45) Date of Patent: Jan. 10, 2023

(54) ELECTRONIC DEVICE

(71) Applicant: GIO Optoelectronics Corp, Tainan (TW)

(72) Inventor: Chin-Tang Li, Tainan (TW)

(73) Assignee: GIO OPTOELECTRONICS CORP., Tainan (TW)

( * ) Notice: Subject to any disclaimer, the term of this patent is extended or adjusted under 35 U.S.C. 154(b) by 86 days.

(21) Appl. No.: 17/230,452

(22) Filed: Apr. 14, 2021

(65) Prior Publication Data
US 2021/0329782 A1 Oct. 21, 2021

(30) Foreign Application Priority Data

Apr. 15, 2020 (TW) .................. 109204440

(51) Int. Cl.
*H05K 1/11* (2006.01)
*H05K 1/18* (2006.01)
*H05K 3/46* (2006.01)

(52) U.S. Cl.
CPC ............. *H05K 1/111* (2013.01); *H05K 1/181* (2013.01); *H05K 3/467* (2013.01); *H05K 2201/0317* (2013.01); *H05K 2201/10098* (2013.01)

(58) Field of Classification Search
CPC ...... H05K 1/111; H05K 1/181; H05K 1/0274; H05K 1/141; G02B 6/42
See application file for complete search history.

(56) References Cited

U.S. PATENT DOCUMENTS

2005/0224946 A1* 10/2005 Dutta .................. G02B 6/4257
257/686

* cited by examiner

*Primary Examiner* — Jeremy C Norris
(74) *Attorney, Agent, or Firm* — Muncy, Geissler, Olds & Lowe, P.C.

(57) ABSTRACT

An electronic device includes a circuit board, a driving member, and a working member. The circuit board has a board body, conductive lines, and conductive pads. The board body has a working surface. The driving member includes a substrate, a thin film circuit, a thin film element, and connection pads. The thin film circuit corresponds to thin film element and is electrically connected to the connection pads, and the connection pads are connected to partial conductive pads. The substrate has a first top surface. The working member has at least one electrode electrically connected to one of the conductive pads. The working member has a second top surface. A first height is defined between the first top surface and the working surface, and a second height is defined between the second top surface and the working surface. The second height is greater than or equal to the first height.

18 Claims, 6 Drawing Sheets

ELECTRONIC DEVICE

CROSS REFERENCE TO RELATED APPLICATIONS

This Non-provisional application claims priority under 35 U.S.C. § 119(a) on Patent Application No(s). 109204440 filed in Taiwan, Republic of China on Apr. 15, 2020, the entire contents of which are hereby incorporated by reference.

BACKGROUND

Technology Field

The present disclosure relates to an electronic device and, in particular, to an electronic device having application flexibility, which can be suitable for the requirement of various products.

Description of Related Art

Generally, in the manufacture of conventional electronic devices (e.g. photoelectric devices), multiple thin film transistors are fabricated on a substrate to form a thin film transistor substrate, and then photoelectric elements are placed thereon, wherein the photoelectric elements are driven by the corresponding thin film transistors. However, the elements (such as thin film transistors and corresponding photoelectric elements) are usually configured without considering the interference issues therebetween (e.g. optical interference). The manufactured thin film transistor substrate can only be used in a limited application (e.g. limited to the same pixel) based on the specification of the current design (e.g. the pixels of the current design). Therefore, it is necessary to design the corresponding thin film process for the product size or function of each electronic device, and the expensive thin film transistor process/mask/substrate/material is required. This manufacturing criteria is very unfavorable to the needs of diverse products and applications, and it is also lack of flexibility in application.

SUMMARY

An objective of this disclosure is to provide a novel electronic device, which does not incur the interference issue between the elements thereof (e.g. optical interference, sensitivity interference).

Another objective of this disclosure is to provide a novel electronic device, which has a high flexibility in the arrangement of elements and in application, so that it can be suitable for the needs of diverse products.

To achieve the above, the disclosure provides an electronic device, which comprises a circuit board, a driving member, and a working member. The circuit board has a board body, a plurality of conductive lines, and a plurality of conductive pads. The board body is defined with a working surface, the conductive lines and the conductive pads are disposed on the working surface, and the conductive pads are correspondingly and electrically connected to the conductive lines. The driving member includes a substrate, a thin film circuit, a thin film element, and a plurality of connection pads. The thin film circuit corresponds to the thin film element and is electrically connected to the connection pads. The connection pads are electrically connected to a part of the conductive pads on the circuit board, respectively. The substrate is defined with a first top surface away from the working surface. The working member is disposed adjacent to the driving member and located on the circuit board. The working member has at least one electrode, and the electrode is electrically connected to one of the conductive pads on the working surface of the board body. The working member is defined with a second top surface away from the working surface. A first height is defined between the first top surface of the substrate and the working surface of the board body, and a second height is defined between the second top surface of the working member and the working surface of the board body. The second height is greater than or equal to the first height.

As mentioned above, in the electronic device of this disclosure, the second height defined between the second top surface of the working member and the working surface of the board body is greater than or equal to the first height defined between the first top surface of the substrate and the working surface of the board body. This structural design can avoid the issue such as the optical or sensitive interference between the driving member and the working member when the driving member drives the working member. Moreover, the electronic device of this disclosure can optionally use any of different working member and the corresponding driving member for different application fields, thereby being suitable for the applications in different technical fields. In addition, the driving member and the working member on the circuit board are independently arranged, the arrangement flexibility thereof is quite high. This application flexibility is suitable for the needs of diverse products.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
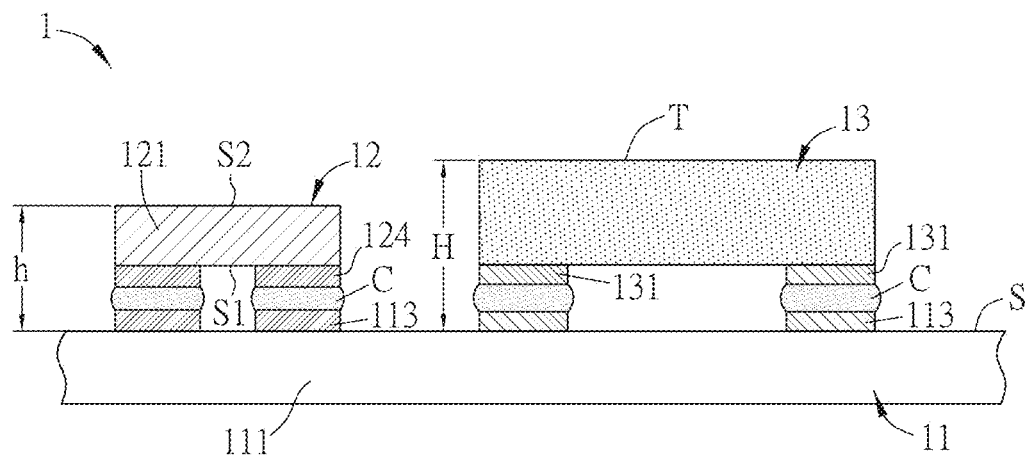
FIGS. 1A and 1B are a side view and a top view of an electronic device according to an embodiment of this disclosure.
Figure 1B:
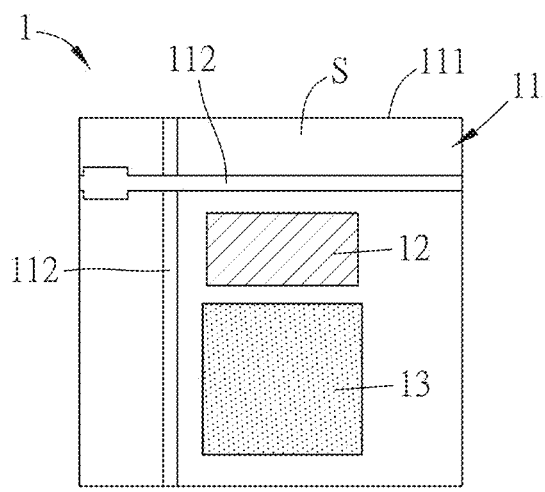
Figure 2:
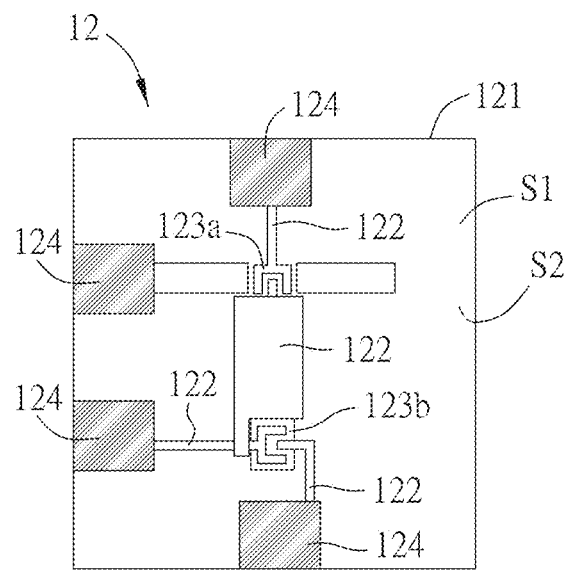
FIG. 2 is a schematic diagram showing a driving member according to an embodiment of this disclosure.

FIGS. 1A and 1B are a side view and a top view of an electronic device according to an embodiment of this disclosure, and FIG. 2 is a schematic diagram showing a driving member according to an embodiment of this disclosure.

With reference to FIGS. 1A and 1B, an electronic device 1 of this embodiment comprises a circuit board 11, a driving member 12 and a working member 13. The driving member 12 and the working member 13 are disposed on and electrically connected to the circuit board 11. The circuit board 11 can drive the working member 13 to operate through the driving member 12. A specific height design of the driving member 12 and the working member 13 is provided.

The circuit board 11 can be a driving circuit board and has a board body 111, a plurality of conductive lines 112, and a plurality of conductive pads 113. The board body 111 can be an insulation substrate or a conductive substrate coated with an insulation layer, and this disclosure is not limited. The board body 111 is defined with a working surface S, and the conductive lines 112 and the conductive pads 113 are disposed on the working surface S. The conductive pads 113 are correspondingly and electrically connected to the conductive lines 112. In this embodiment, for example, the circuit board 11 includes four conductive pads 113 (see FIG. 1A) and two interlaced conductive lines 112 (see FIG. 1B). In some embodiments, the electronic device 1 can be a display device, and the number of the conductive lines 112 can be greater than two. The conductive lines 112 can be, for example but not limited to, scan lines, data lines, power lines (Vdd), ground lines (Vss), and any combination thereof, or any of other lines for transmitting electrical signals. In some embodiments, the circuit board 11 can be a flexible circuit board or a rigid circuit board.

As shown in FIG. 2, the driving member 12 comprises a substrate 121, a thin film circuit 122, at least one thin film element, and a plurality of connection pads 124. The driving member 12 of this embodiment as shown in FIG. 2 includes, for example, two thin film elements (thin film transistors) 123a, 123b, four connection pads 124, and a plurality of thin film circuits 122, so that the driving member 12 can function as a thin film transistor substrate. Herein, for example, FIG. 2 shows a 2T1C circuit structure. In different embodiments, it can be any of other circuit structures such as 4T2C or 5T1C, and this disclosure is not limited.

Referring to FIGS. 1A and 2, the substrate 121 of the driving member 12 is defined with a first surface S1 facing the working surface S of the board body 111 and a second surface S2 opposite to the first surface S1, and the thin film circuit 122, the thin film elements 123a, 123b, and the connection pads 124 are disposed on the substrate 121 (which can be disposed, for example but not limited to, in the substrate 121 or on any surface of the substrate 121). In some embodiments, the thin film circuit 122, the thin film elements 123a, 123b, and the connection pads 124 are all disposed on the first surface S1 or the second surface S2. In some embodiment, at least the connection pads 124 are disposed on the first surface S1 or the second surface S2 of the substrate 121. In addition, the thin film transistors 123a and 123b are electrically connected to each other through the thin film circuit 122. In some embodiments, the thin film circuit 122 can be directly electrically connected to the thin film transistors 123a and 123b, or indirectly electrically connected to the thin film transistors 123a and 123b (through other conductive layers). In addition, the thin film circuit 122 can be a conductive line for electrically connecting the two thin film transistors 123a and 123b, or the thin film circuit 122 can be a conductive line for electrically connecting the thin film transistor 123a or 123b to other components. This disclosure is not limited. To be noted, the aforementioned thin film circuit 122 is a general term. Any circuit formed on the substrate 121 by the thin film process, which contains the conductive layer or lines, can be generally named as the thin film circuit 122. In some embodiments, the thin film circuit 122 may also include the lines for transmitting scan signals or data signals, which depends on the function and purpose of the electronic device.

The thin film circuit 122 corresponds to the thin film elements 123a, 123b and is electrically connected to the connection pads 124 (FIG. 2), and the connection pads 124 are electrically connected to a part of the conductive pads 113 on the circuit board 11, respectively (FIG. 1A). In this embodiment, the connection designs of the substrate 121 and the driving member 12 are: the second surface S2 of the substrate 121 is disposed away from the working surface S of the board body 111, so that the second surface S2 can also be realized as a first top surface of the substrate 121. In addition, the first surface S1 of the substrate 121 is disposed facing the working surface S of the board body 111, and the driving member 12 is disposed above the working surface S of the circuit board 11, so that the connection pads 124 of the driving member 12 can be electrically connected to a part of the conductive pads 113 on the working surface S, respectively. In this embodiment, the first surface S1 configured with the thin film circuit 122, the thin film elements 123a, 123b, and the connection pads 124 is arranged facing the working surface S of the board body 111. The second surface S2 of the substrate 121, which is not configured with the thin film circuit 122, the thin film elements 123a, 123b, and the connection pads 124 (defined as the first top surface of this embodiment), is away from the working surface S of the board body 111. In this embodiment, the first top surface is the second surface S2, which is not configured with any components and remains the same height. The above-mentioned substrate 121 can be a rigid substrate, a flexible substrate, or the combination thereof. The rigid substrate can be, for example but not limited to, a glass substrate, and the flexible substrate can be, for example but not limited to, a polyimide (PI) substrate. In some embodiments, the thickness of the substrate 121 of the driving member 12 is, for example, less than 200 μm. Herein, a thinning process can be used to reduce the thickness of the substrate 121 (e.g. a glass substrate) to less than 200 μm. In addition, the material of the connection pads 124 can be, for example but not limited to, copper, silver, gold, or any combination thereof, or any of other suitable conductive materials. In some embodiments, in order to manufacture thicker connection pads 124, for example, the electroplating process, printing process, or evaporation plus lift-off patterning process can be used to form the connection pads 124 on the substrate 121, so that the thin film circuit 122 and the thin film elements 123a, 123b can be electrically connected to the connection pads 124. In other embodiments, the thin film process can also be used to manufacture the connection pads 124, and this disclosure is not limited.

The working member 13 is disposed adjacent to the driving member 12 and located on the circuit board 11 (on any surface of the circuit board 11). In some embodiments, the working member 13 and the driving member 12 are both formed on the working surface S. and are disposed adjacent to each other. The working member 13 has at least one electrode 131, and the electrode 131 is electrically connected to one of the conductive pads 113 on the working surface S of the board body 111. The working member 13 is defined with a second top surface T away from the working surface S. The working member 13 can be, for example but not limited to, an element in millimeter scale or micrometer scale, but this disclosure is not limited thereto. The working member 13 can be, for example but not limited to, a photoelectric element, a pyroelectric element, a piezoelectric element, a sensing element, or an antenna module. In this embodiment, the photoelectric element can be, for example but not limited to, an LED chip or package, a micro LED chip or package, or any photoelectric chip or package in any dimension such as, for example but not limited to, in or under millimeter scale or micrometer scale. The piezoelectric element can be, for example but not limited to, a piezoelectric fingerprint chip. The sensing element can be, for example but not limited to, an IR sensing chip, a ultrasonic sensing chip, a temperature sensing chip, or an image sensor. The above-mentioned LED chip can comprise an LED die with horizontal electrodes, flip-chip electrodes, or vertical electrodes, and the LED chip can be disposed on the working surface S of the circuit board 11 and electrically connected to the conductive pads 113 by wire bonding or flip-chip bonding. To be noted, the second top surface T defined on the working member 13 is not limited to the wire bonding or flip-chip bonding, or the horizontal electrodes or vertical electrodes. For example, the surface of the working member 13 away from the working surface S may be provided with bonding wires or electrodes, which result in an uneven surface, so that the second top surface T should be realized as the surface defined by the bonding wires or electrodes, and other elements.

To be noted, the above-mentioned working member 13 can be an interface device electrically connected to a receiver or a transmitter, which can be disposed inside or outside the electronic device. In some embodiments, the work member 13 may be a proximity sensor, for example, including a capacitive sensor (e.g. a complementary metal oxide semiconductor (CMOS)), a capacitive displacement sensor, a Doppler effect sensor (a sensor based on Doppler effect), an inductive sensor, a magnetic sensor (including magnetic proximity fuse), an optical sensor, a photoelectric sensor, a photocell sensor (reflective sensor), a laser rangefinder, a passive sensor (e.g. a charge-coupled device), a passive thermal infrared sensor, an ionizing radiation reflection sensor, a sonar sensor (typically active or passive), a ultrasonic sensor, a fiber optics sensor, a Hall effect sensor, or the like. In addition, the working member 13 may also be a temperature sensor, for example, including a thermal scanner, a thermocouple, a resistance thermometer, a silicon bandgap temperature sensor, or the like. In addition, the working member 13 may also be an X-ray detector, an antenna, or an interface device of the like. In addition, the working member 13 may also be a pressure sensor. The working member 13 can be realized as any electronic component, and is not limited to the above-mentioned examples, but can be applied to the surface mount technology (SMT).

As shown in FIG. 1A, the working member 13 of this embodiment is, for example, an LED chip with horizontal electrodes, and two electrodes 131 thereof are electrically connected to two conductive pads 113 on the working surface S, respectively, by flip-chip bonding. Herein, the electrode 131 of the working member 13 and the connection pad 124 of the driving member 12 are electrically connected to the corresponding conductive pad 113 through a conductive member C, and the circuit board 11 can drive the working member 13 through the driving member 12. For example, if the working member 13 is a micro LED chip or package, it can be driven to emit light. The material of the conductive member C can comprise, for example but not limited to, solder paste, silver paste, or anisotropic conductive film (ACF), or a combination thereof, or any of other suitable conductive materials. In some embodiments, when the working member 13 is a micro LED package, it may comprise a carrier board and at least one micro LED chip, and the micro LED chip is disposed on the carrier board. The electrodes of the micro LED package correspond and electrically connect to the conductive pads 113 on the circuit board 11.

As shown in FIG. 1A, in the electronic device 1 of this embodiment, a first height h is defined between the second surface S2 (the first top surface) of the substrate 121 of the driving member 12 and the working surface S on the board body 111 of the circuit board 11, and a second height H is defined between the second top surface T of the working member 13 and the working surface S of the board body 111. The second height H is greater than or equal to the first height h (H≥h). When the driving member 12 drives the working member 13 to operate, the driving member 12 does not generate the interference to the working member 13. Specifically, in this embodiment, since the second height H is greater than or equal to the first height h, the driving member 12 does not cause optical interference to the light path of the working member 13 (LED), thereby avoiding the interference of the light emitting thereof. In other embodiments, when the working member 13 is, for example, a sensing element (e.g. sensor), since the second height H is greater than or equal to the first height h, the driving member 12 does not cause interference to the detection sensitivity of the working member 13 (sensing element), thereby avoiding the interference of the detection result thereof. In addition, in order to avoid the light reflection caused by the substrate 121 and prevent the interference to the light emitting of the LED, the substrate 121 of the driving member 12 can be a light absorption substrate, which comprises a light absorption material. This configuration can prevent the light reflection from the substrate 121.

For the sake of easy description, the work member 13 in some embodiments of the disclosure is, for example, a micro LED chip. However, in addition to this, the electronic device 1 of this embodiment can also select different working members 13 and corresponding driving members 12 according to different technical fields. It should be understood that the working member 13 can be, for example, any electronic element such as any of the aforementioned different photoelectric elements, pyroelectric elements, piezoelectric elements, sensing elements or antenna modules, which can provide electromagnetic waves, light waves, sound waves, pressure waves, or other types of signals for different technical fields. Moreover, the components (the driving member 12 and the working member 13) on the circuit board 11 are independent, and the arrangement flexibility thereof is quite high. For example, one driving member 12 can be cooperated with one working member 13, or one driving member 12 can be cooperated with multiple working members 13. Therefore, this embodiment can also have flexibility in application and can be suitable for the needs of diverse products.

FIGS. 3A to 3D are side views of electronic devices according to different embodiments of this disclosure.

Figure 3A:
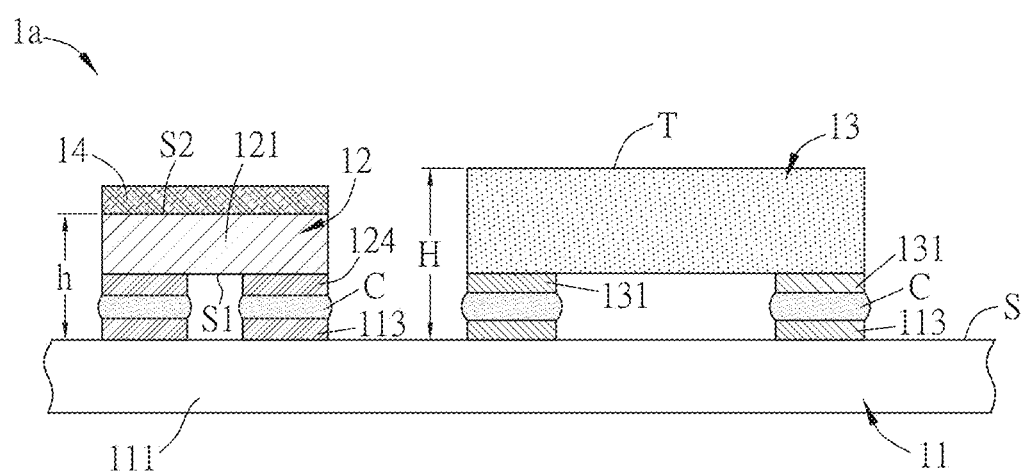
FIGS. 3A to 3D are side views of electronic devices according to different embodiments of this disclosure.

Referring to FIG. 3A, the configurations and connections of components of the electronic device 1a of this embodiment are mostly the same as those of the electronic device 1 of the above embodiment. Different form the above embodiment, the substrate 121 of the driving member 12 of the electronic device 1a of this embodiment is configured with a wave absorption layer 14 along the second surface S2. The wave absorption layer 14 can be a wave absorption film, which can be, for example, attached to the second surface S2. Accordingly, when the LED (the working member 13) emits light, the wave absorption layer 14 can absorb the light (wave) emitted toward the second surface S2 of the substrate 121, thereby decreasing the possibility of light (wave) reflection and thus avoiding the interference of light emitting. Moreover, in different embodiments, the substrate 121 of the driving member 12 can also be configured with a haze layer, a plurality of wave absorption structures, a plurality of haze structures, a reflective layer, or a plurality of reflective structures. In some embodiments, the second surface S2 of the substrate 121 inherently comprises a haze layer, a plurality of wave absorption structures, a plurality of haze structures, or a plurality of reflective structures. Herein, the plurality of wave absorption structures, the plurality of haze structures, or the plurality of reflective structures can be distributed (discontinuous) structures. For example, the second surface S2 of the substrate 121 can be configured with saw-tooth structures diffuser structures so as to form the haze or wave absorption structures, thereby providing the wave absorption, wave haze, or wave reflection effect. In some embodiments, for example, the surface processing method may be a physical surface treatment or a chemical surface treatment, thereby increasing the roughness and enhancing the haze effect of light (wave). In other embodiments, the second surface S2 of the substrate 121 can also be coated with a black absorbing layer or absorbing points to absorb light (waves). In other embodiments, a plurality of sprayed black points can also be formed on the second surface S2 by, for example, a spraying manner, and the plurality of sprayed black points can function as a plurality of wave absorption structures. It is particularly noted that the wave absorption layer 14 of this embodiment can also be applied to other embodiments. In other embodiments, a material with high reflectivity, such as a metal material, can be coated on the second surface S2 by spraying, printing or any similar technique so as to form a reflective layer or reflective structure(s).

Figure 3B:
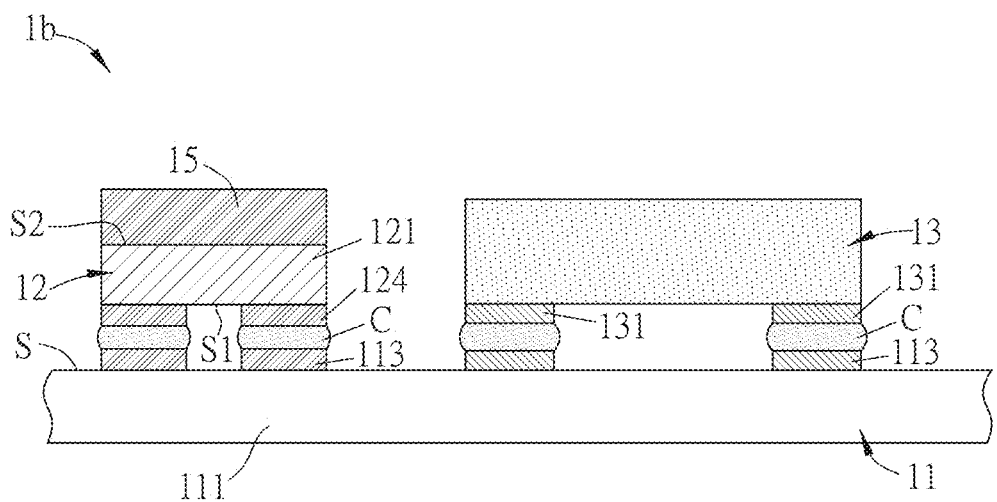

In addition, referring to FIG. 3B, the configurations and connections of components of the electronic device 1b of this embodiment are mostly the same as those of the electronic device 1 of the above embodiment. Different form the above embodiment, the electronic device 1b of this embodiment further comprises a black photoresist member 15, which at least covers the driving member 12 or a part of the circuit board 11. In this embodiment, for example, the black photoresist member 15 covers the second surface S2 of the substrate 121 of the driving member 12. Herein, the black photoresist member 15 can absorb the light (wave) emitted to the second surface S2 of the substrate 121, thereby avoiding the interference to the light emitted by the LED and improving the contrast. The material of the black photoresist member 15 can be a black matrix resist, which covers the driving member 12, or covers the driving member 12 and the circuit board 11 with exposing the working member 13 only.

Figure 3C:
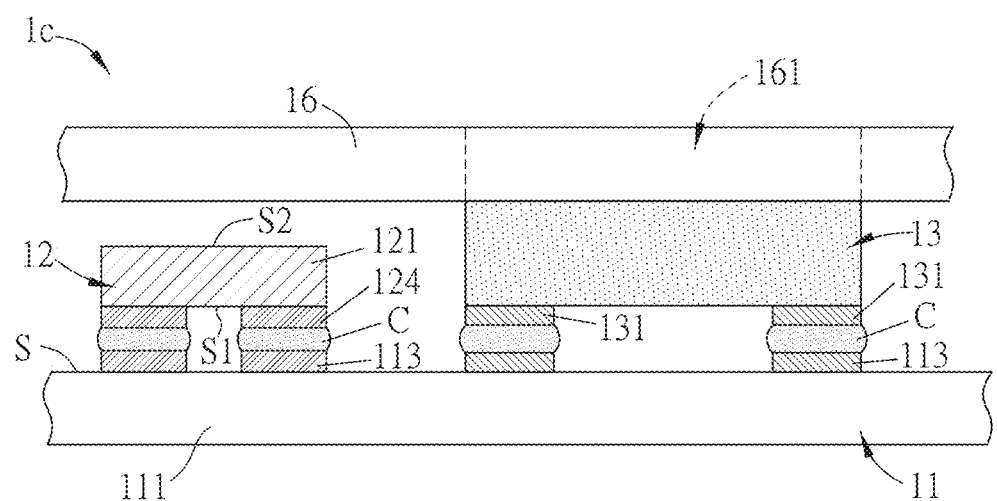

In addition, referring to FIG. 3C, the configurations and connections of components of the electronic device 1c of this embodiment are mostly the same as those of the electronic device 1 of the above embodiment. Different form the above embodiment, the electronic device 1c of this embodiment further comprises an optical member 16, which is disposed at one side of the working surface S of the circuit board 11, and the optical member 16 covers all or at least a part of the working surface S of the circuit board 11. In this embodiment, the optical member 16 can be defined with or without a window 161. In one embodiment, the optical member 16 is disposed above the driving member 12 and the working member 13 and covers the driving member 12 and the working member 13, and the optical member 16 can be defined with or without the window 161. In some embodiments, for example, when the electronic device is a backlight module, the optical member 16 is defined without the window 161, and it can be a diffuser plate or a light-guiding plate with continuous optical characteristics for softening or transmitting the light (wave) emitted from the working member 13 (e.g. a micro LED chip). Thus, the electronic device 1 can output light evenly. To be noted, in this embodiment, the optical member 16 with continuous optical characteristics means that the optical member 16 itself is a continuous integral object, and the optical characteristics of the integral object also exhibit continuity (due to the structure without defining the window or the likes). In some embodiments, the optical member 16 is defined with a window 161, which is configured corresponding to the working member 13 and/or the driving member 12, so that the light (wave) emitted from the working member 13 (e.g. a micro LED chip) can pass through the window 161 and be spread. In some embodiments, for example, when the electronic device is a display module, the window 161 can be an opening configured through the optical member 16 (e.g. a diffuser plate or a light-guiding plate). In another aspect, the optical member 16 (e.g. a diffuser plate or a light-guiding plate) can be further configured with a shielding layer, and the window 161 is defined as the area, which is not covered by the shielding layer. In some embodiments, the working member 13 and/or the driving member 12 can be configured through the window 161 (opening) and at least partially overlapped with the window 161 (opening), and the light (wave) emitted from the working member 13 (e.g. a micro LED chip) can be spread from the second top surface T through the window 161. In some embodiments, the light (wave) emitted from the working member 13 (e.g. a micro LED chip) diverges in at least a semicircular shape, and the work piece 13 passes through the window 161, which is an opening, and at least partially overlaps with the window 161, and then be spread through the window 161. In some embodiments, for example, when the electronic device is a display module, the optical member 16 can be a reflective plate or a light absorption plate. The optical member 16 can be optionally selected with any of various functions based on the operation situation. In this case, the reflective plate can improve the brightness of the electronic device, and the light absorption plate can prevent the interference to the light emitting of the LED caused by the external light (wave). To be noted, the configuration of the optical plate 16 does not affect the height relations between the driving member 12 and the working member 13.

Figure 3D:
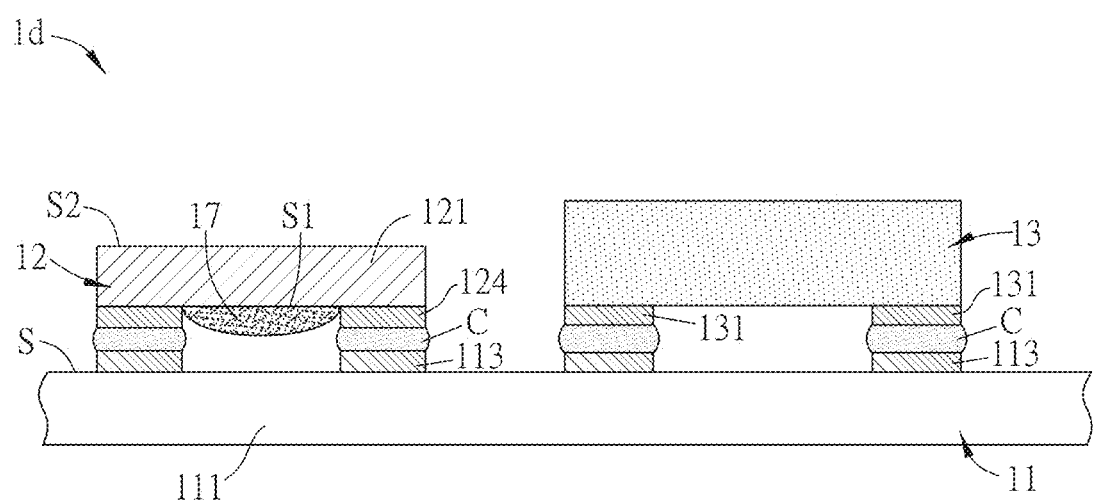

In addition, referring to FIG. 3D, the configurations and connections of components of the electronic device 1d of this embodiment are mostly the same as those of the electronic device 1 of the above embodiment. Different form the above embodiment, the electronic device 1d of this embodiment further comprises a protective member 17, which is disposed on the first surface S1 of the substrate 121 and at least covers the thin film element. In this embodiment, the protective member 17 can be formed on the thin film element by resin transfer molding, sealant dispensing, or any of other suitable methods. The configuration of the protective member 17 can prevent the external moisture or dusts from entering the thin film element, thereby protecting the characteristics of the thin film element. Preferably, the protective member 17 can cover the thin film element and the thin film circuit. The material of the protective member 17 can be, for example, a polymer material (e.g. PI).

To be noted, the user can adopt any one or combination of the additional elements as mentioned in the embodiments of FIGS. 3A to 3D, including the wave absorption layer 14, the haze layer, the reflective layer, the wave absorption structure, the haze structure, the reflective structure, the black photoresist member 15, the protective member 17, the optical member 16, and any modification thereof (e.g. the reflective plate, light absorption plate, diffuser plate, or light-guiding plate), based on the actual requirement, and the combination or application thereof in this disclosure is not limited.

Figure 4:
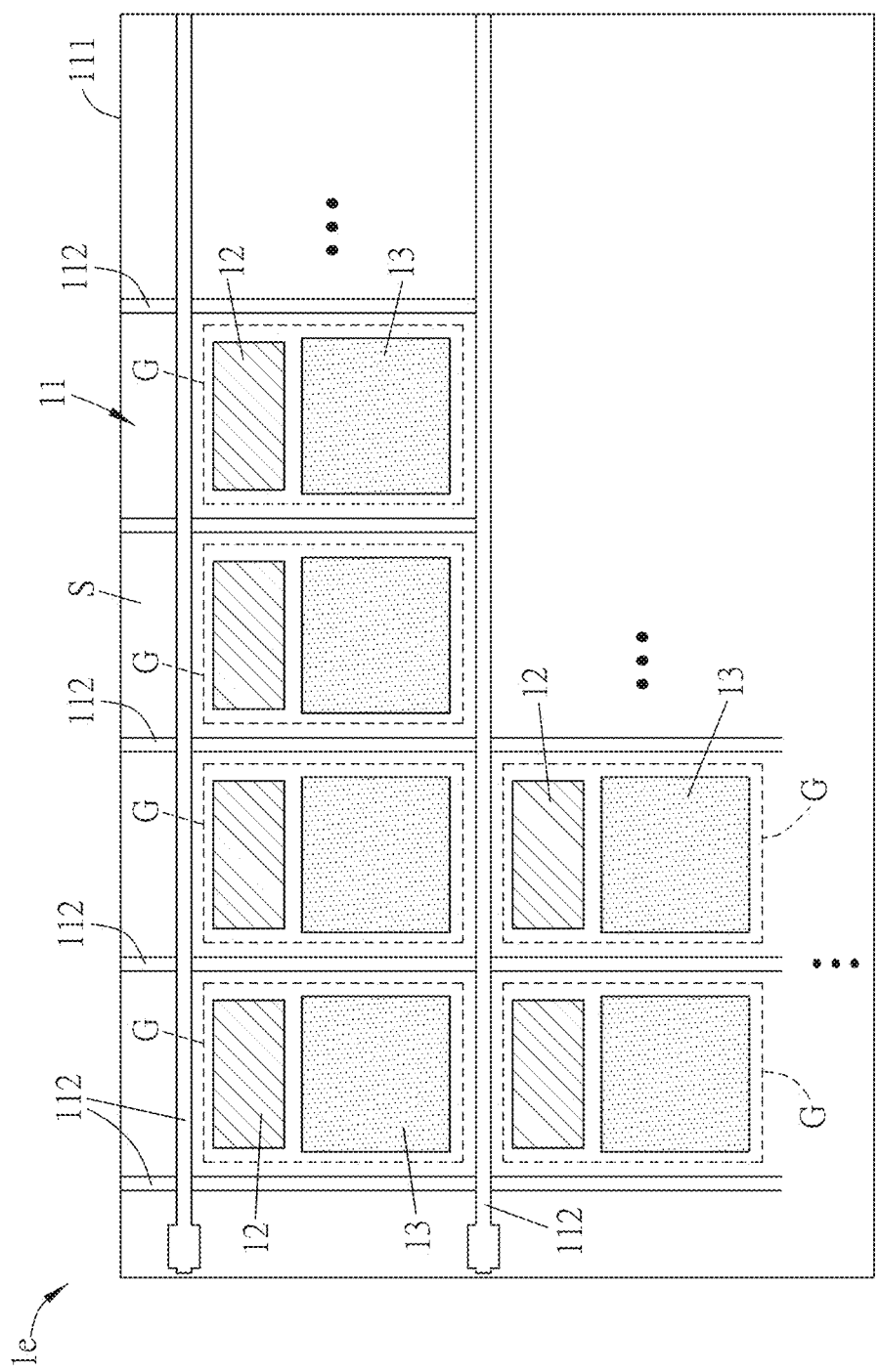
FIGS. 4 and 5 are side views of electronic devices according to different embodiments of this disclosure.
Figure 5:
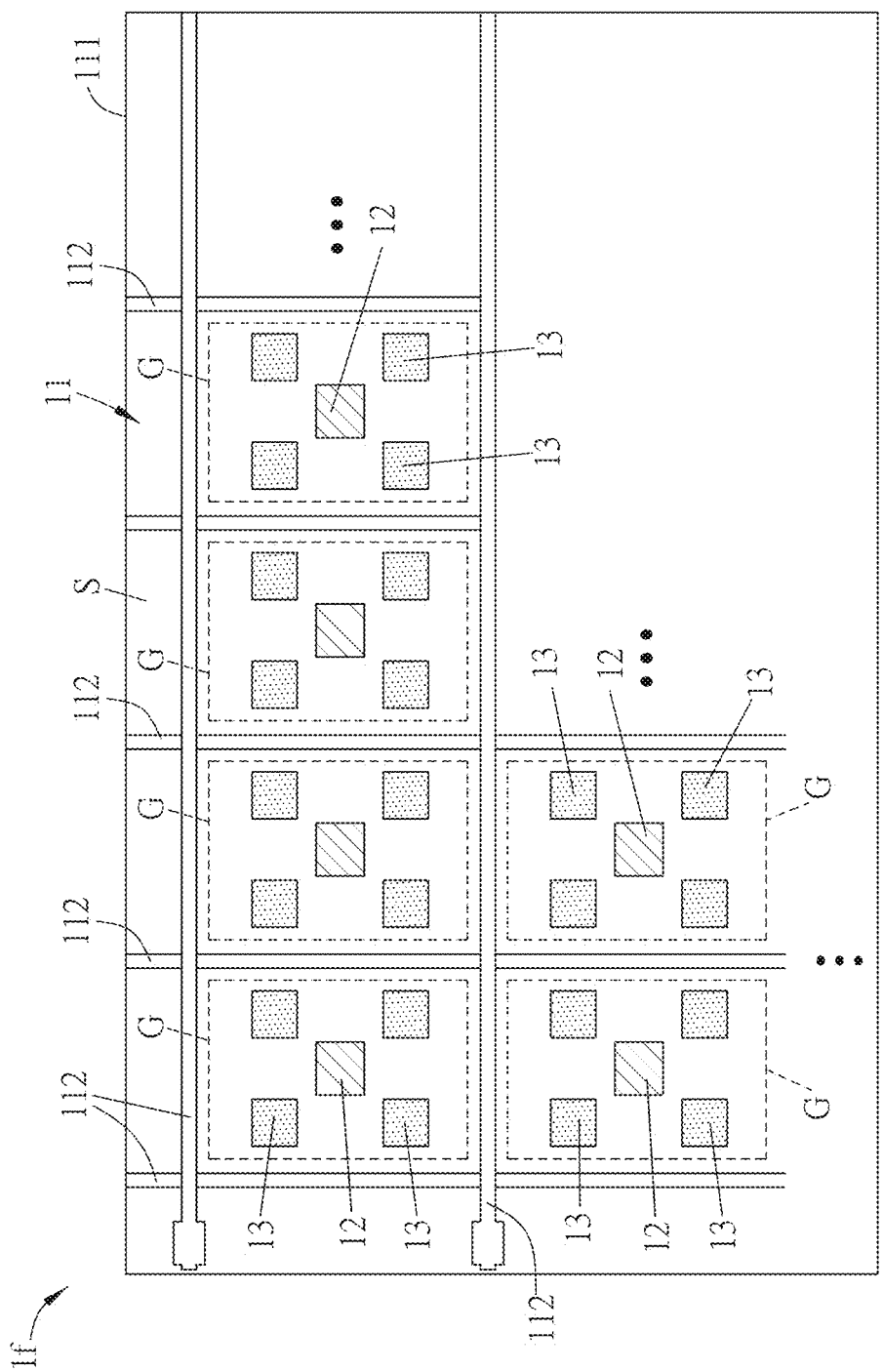

FIGS. 4 and 5 are side views of electronic devices according to different embodiments of this disclosure.

In the electronic device 1e of FIG. 4, the driving member 12 and the working member 13 can be combined and defined as a working group G, and a plurality of working groups G can be installed on any surface or the same surface (e.g. the working surface S) of the circuit board 11. The circuit board 11 can drive the working member 13 through the corresponding driving member 12 in the same working group G. The multiple working groups G can be arranged on the working surface S in one dimensional or two dimensional array or in irregular arrangement. In addition, the multiple working groups G can be arranged in a circle, an oval, or a polygon, and this disclosure is not limited. In this embodiment, for example, the multiple working groups G are arranged in two dimensional array.

In addition, in the electronic device 1f of FIG. 5, each working group G comprises four working members 13, and the driving member 12 of the working group G can correspondingly drive the four working members 13. The number of the working members 13 in each working group G of this embodiment is for an example only. In other embodiments, the number of the working members 13 in each working group G can be two, three, five, and etc.

In summary, in the electronic device of this disclosure, the second height defined between the second top surface of the working member and the working surface of the board body is greater than or equal to the first height defined between the first top surface of the substrate and the working surface of the board body. This structural design can avoid the issue such as the optical or sensitive interference between the driving member and the working member when the driving member drives the working member. Moreover, the electronic device of this disclosure can optionally use any of different working member and the corresponding driving member for different application fields, thereby being suitable for the applications in different technical fields. In addition, the driving member and the working member on the circuit board are independently arranged, the arrangement flexibility thereof is quite high. This application flexibility is suitable for the needs of diverse products.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
   a circuit board having a board body, a plurality of conductive lines, and a plurality of conductive pads, wherein the board body is defined with a working surface, the conductive lines and the conductive pads are disposed on the working surface, and the conductive pads are correspondingly and electrically connected to the conductive lines;
   a driving member including a substrate, a thin film circuit, a thin film element, and a plurality of connection pads, wherein the thin film circuit corresponds to the thin film element and is electrically connected to the connection pads, the connection pads are electrically connected to a part of the conductive pads on the circuit board, respectively, and the substrate is defined with a first top surface away from the working surface; and
   a working member disposed adjacent to the driving member and located on the circuit board, wherein the working member has at least one electrode, the electrode is electrically connected to one of the conductive pads on the working surface of the board body, and the working member is defined with a second top surface away from the working surface;
   wherein, a first height is defined between the first top surface of the substrate and the working surface of the board body, a second height is defined between the second top surface of the working member and the working surface of the board body, and the second height is greater than or equal to the first height.

2. The electronic device of claim 1, wherein the substrate is a glass substrate.

3. The electronic device of claim 1, wherein the substrate is a polyimide (PI) substrate.

4. The electronic device of claim 1, wherein the substrate is a light absorption substrate.

5. The electronic device of claim 1, wherein the working member comprises a photoelectric element, a pyroelectric element, a piezoelectric element, a sensing element, or an antenna module.

6. The electronic device of claim 1, wherein the substrate is defined with a first surface facing the working surface of the board body and a second surface opposite to the first surface, the substrate comprises a plurality of wave absorption structures, a plurality of haze structures, a wave absorption layer, a haze layer, a reflective layer, or a reflective structure.

7. The electronic device of claim 6, wherein the wave absorption layer is a wave absorption film.

8. The electronic device of claim 6, wherein the wave absorption structures comprise a plurality of sprayed black points.

9. The electronic device of claim 6, wherein the second surface comprises the haze structure, the haze layer, the reflective layer or the reflective structure.

10. The electronic device of claim 1, further comprising:
    a black photoresist member at least covering the driving member or a part of the circuit board.

11. The electronic device of claim 1, further comprising:
    an optical member disposed at one side of the working surface of the circuit board, wherein the optical member covers at least a part of the working surface of the circuit board.

12. The electronic device of claim 11, wherein the optical member is defined with a window, and the window corresponds to the working member and/or the driving member.

13. The electronic device of claim 12, wherein the optical member is further configured with a shielding layer, and the window is defined by a portion on the optical member without being covered by the shielding layer.

14. The electronic device of claim 12, wherein the window is an opening defined through the optical member.

15. The electronic device of claim 11, wherein the optical member is a reflective plate, a light absorption plate, a diffuser plate, or a light-guiding plate.

16. The electronic device of claim 1, further comprising:
    a protective member at least covering the thin film element.

17. The electronic device of claim 1, wherein the driving member and at least one of the working members are together defined as a working group, and a plurality of the working groups are disposed on the working surface of the circuit board.

18. The electronic device of claim 17, wherein each of the working groups comprises a plurality of working members, and the driving member drives the working members.

* * * * *